(12) United States Patent
Kloos

(10) Patent No.: US 10,468,728 B2
(45) Date of Patent: Nov. 5, 2019

(54) ELECTRONIC SWITCHING DEVICE OF A BATTERY MANAGEMENT SYSTEM, AND BATTERY

(71) Applicant: VARTA Microbattery GmbH, Ellwangen Jagst (DE)

(72) Inventor: Dieter Kloos, Fichtenau (DE)

(73) Assignee: VARTA Microbattery GmbH, Ellwangen Jagst (DE)

(*) Notice: Subject to any disclaimer, the term of this patent is extended or adjusted under 35 U.S.C. 154(b) by 30 days.

(21) Appl. No.: 15/886,968

(22) Filed: Feb. 2, 2018

(65) Prior Publication Data

US 2018/0226694 A1 Aug. 9, 2018

(30) Foreign Application Priority Data

Feb. 8, 2017 (EP) ..................................... 17155124

(51) Int. Cl.
*H02J 7/00* (2006.01)
*H01M 10/44* (2006.01)
*H03K 17/687* (2006.01)

(52) U.S. Cl.
CPC ............ *H01M 10/44* (2013.01); *H02J 7/0031* (2013.01); *H03K 17/6874* (2013.01); *H03K 2217/0018* (2013.01)

(58) Field of Classification Search
CPC ............... H02J 7/0031; H02J 2007/004; H02J 2007/0037; Y02E 60/12; H01M 10/48

USPC ......................................................... 320/134
See application file for complete search history.

(56) References Cited

U.S. PATENT DOCUMENTS

| 5,909,103 A | 6/1999 | Williams | |
|---|---|---|---|
| 2003/0122525 A1* | 7/2003 | Stellberger | ............ H02J 7/0026 320/134 |
| 2005/0017688 A1 | 1/2005 | Stellberger | |
| 2008/0157718 A1* | 7/2008 | Ohnuki | .................. H02J 7/0021 320/134 |
| 2008/0278116 A1* | 11/2008 | Matsunaga | ........... H01M 10/44 320/134 |
| 2009/0072790 A1* | 3/2009 | Ibrahim | ................ H02J 7/0031 320/134 |

FOREIGN PATENT DOCUMENTS

| EP | 1 498 998 A1 | 1/2005 |
|---|---|---|
| EP | 2110934 A1 | 10/2009 |

* cited by examiner

*Primary Examiner* — Arun C Williams
(74) *Attorney, Agent, or Firm* — DLA Piper LLP (US)

(57) ABSTRACT

A battery includes a battery cell assembly, a battery management system, and including a switching device, wherein the battery management system includes a monitoring device that monitors parameters relevant to correct operation and safety, and the monitoring device includes a control unit coupled to the switching device such that it can interrupt a flow of current between the battery cell assembly and the voltage source.

4 Claims, 2 Drawing Sheets

ELECTRONIC SWITCHING DEVICE OF A BATTERY MANAGEMENT SYSTEM, AND BATTERY

TECHNICAL FIELD

This disclosure relates to an electronic switching device which is part of a battery management system, and to a battery having such a battery management system.

BACKGROUND

A battery generally comprises a plurality of battery cells and a battery management system. The battery management system in turn usually comprises a monitoring device that monitors the behavior of the battery cells, and a switching device that ensures that a current flows to and/or from the battery cells only when permitted by the monitoring device. The monitoring device monitors parameters relevant to the correct operation and safety. These parameters also include, for example, the temperature of the battery.

The switching device usually uses semiconductor switching elements, in particular MOSFETs. These have the property that they can operate as switches only in one direction since they can block the flow of current only in one direction. Since, however, blocking is possibly necessary in both directions, those semiconductor switching elements are connected in series in the reverse orientation (anti-series). Both charging currents and discharging currents can therefore be switched off. To ensure a sufficient current-carrying capacity, multiple such arrangements of semiconductor switching elements connected in series are often arranged in a parallel manner.

The known arrangement of the semiconductor switching elements is symmetrical. This means that the same number of semiconductor switching elements is respectively used to block the flow of current in both directions. The semiconductor switching elements used are identical in this case and differ within the switching device only in terms of the direction in which they are connected. In particular, all semiconductor switching elements used have the same dielectric strength. In electronic components such as semiconductor switching elements, the parameter of the dielectric strength is known to indicate the voltage at which the corresponding component can still be operated.

However, known switching devices for a battery management system have disadvantages in terms of costs and efficiency. It could therefore be helpful to provide an electronic switching device for a battery management system, which switching device has increased efficiency while reducing costs.

SUMMARY

I provide an electronic switching device of a battery management system including an electrical line branch in which at least two semiconductor switching elements connect in series in a reversed (anti-series) orientation, wherein the semiconductor switching elements are adapted to block a flow of current in the electrical line branch in one direction, one end of the line branch connects to a pole of a battery cell assembly and another end connects to a voltage source, at least one of the semiconductor switching elements has, inside the line branch, an orientation that allows it to block a charging current during charging of the battery cell assembly, the at least one semiconductor switching element that blocks the charging current is arranged in a first part of the line branch, at least one of the semiconductor switching elements has, inside the line branch, an orientation that allows it to block a current in a discharging direction during discharging of the battery cell assembly, the at least one semiconductor switching element that blocks the current in the discharging direction is arranged in a second part of the line branch, the at least one semiconductor switching element that blocks the charging current is adapted to the largest possible voltage load possibly occurring in the part in the charging direction, the at least one semiconductor switching element that blocks the discharging current is adapted to a largest possible voltage load possibly occurring in the part in the discharging direction, and that at least one semiconductor switching element that blocks the current in the discharging direction in a second part of the line branch has a higher dielectric strength than the at least one semiconductor switching element that blocks the charging current in the first part of the line branch.

I also provide a battery including a battery cell assembly, a battery management system and including the switching device of a battery management system including an electrical line branch in which at least two semiconductor switching elements connect in series in a reversed (anti-series) orientation, wherein the semiconductor switching elements are adapted to block a flow of current in the electrical line branch in one direction, one end of the line branch connects to a pole of a battery cell assembly and another end connects to a voltage source, at least one of the semiconductor switching elements has, inside the line branch, an orientation that allows it to block a charging current during charging of the battery cell assembly, the at least one semiconductor switching element that blocks the charging current is arranged in a first part of the line branch, at least one of the semiconductor switching elements has, inside the line branch, an orientation that allows it to block a current in a discharging direction during discharging of the battery cell assembly, the at least one semiconductor switching element that blocks the current in the discharging direction is arranged in a second part of the line branch, the at least one semiconductor switching element that blocks the charging current is adapted to the largest possible voltage load possibly occurring in the part in the charging direction, the at least one semiconductor switching element that blocks the discharging current is adapted to a largest possible voltage load possibly occurring in the part in the discharging direction, and that at least one semiconductor switching element that blocks the current in the discharging direction in a second part of the line branch has a higher dielectric strength than the at least one semiconductor switching element that blocks the charging current in the first part of the line branch, wherein the battery management system includes a monitoring device that monitors parameters relevant to correct operation and safety, and the monitoring device includes a control unit coupled to the switching device such that it can interrupt a flow of current between the battery cell assembly and the voltage source.

DETAILED DESCRIPTION

Figure 1:
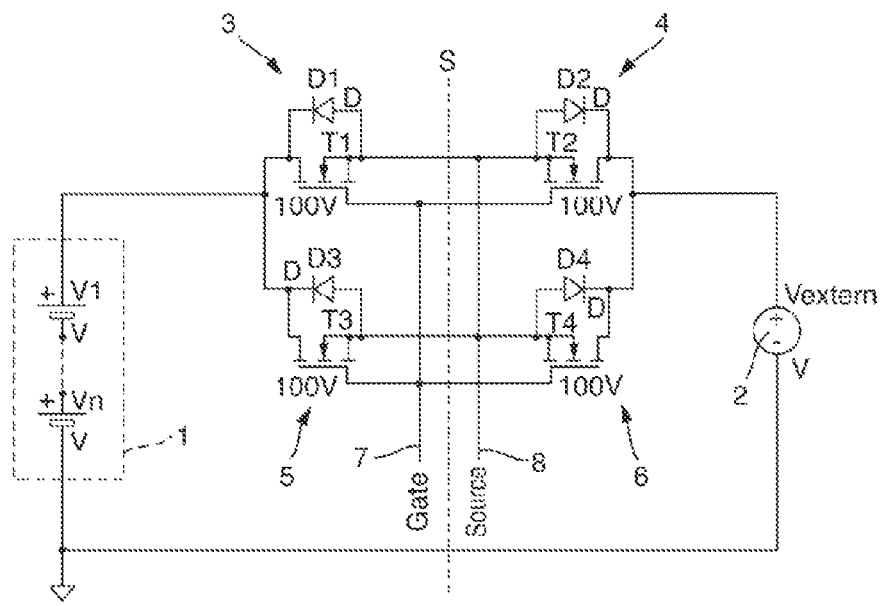
FIG. 1 schematically shows a known switching device that controls the flow of current to and/or from the battery cells of a battery.

In contrast to known devices, my electronic switching device is not symmetrical, but rather the semiconductor switching elements responsible for switching in the discharging direction and the semiconductor switching elements responsible for switching in the charging direction are adapted to their respective maximum expected loads which in turn are likewise not symmetrical.

My electronic switching device thus comprises the following features:

1) An electrical line branch in which at least two semiconductor switching elements are connected in series (anti-series) in the reversed orientation.
2) The semiconductor switching elements are designed to be able to block a flow of current in the line branch in one direction.
3) One end of the line branch connects to a pole of a battery cell assembly and another end connects to a voltage source.
4) At least one of the semiconductor switching elements has, inside the line branch, an orientation that allows it to block a charging current during charging of the battery cell assembly.
5) The at least one semiconductor switching element that blocks the charging current is arranged in a first part of the line branch.
6) At least one of the semiconductor switching elements has, inside the line branch, an orientation that allows it to block a current in the discharging direction during discharging of the battery cell assembly.
7) The at least one semiconductor switching element that blocks the current in the discharging direction is arranged in a second part of the line branch.
8) The at least one semiconductor switching element that blocks the charging current is adapted to the largest possible voltage load possibly occurring in the first part in the charging direction.
9) The at least one semiconductor switching element that blocks the discharging current is adapted to the largest possible voltage load possibly occurring in the second part in the discharging direction.

The voltage source is used, in particular, to charge the battery cell assembly. Accordingly, the voltage source is preferably a DC voltage source.

The DC voltage source may also be, in particular, a DC voltage network that also allows discharging in addition to charging.

The voltage load occurring in the charging direction in the first part of the line branch results from the difference between a charging voltage provided by the voltage source and the voltage of the battery cell assembly. The voltage load is generally at a maximum when the battery cell assembly has been deep-discharged.

The voltage load occurring in the discharging direction in the second part of the line branch results, in the extreme case of a polarity reversal, from addition of the charging voltage provided by the voltage source and the voltage of the battery cell assembly. The voltage load is then at a maximum when the battery cell assembly has been fully charged.

It follows from this that the maximum voltage loads occurring in the discharging direction are generally greater than the maximum voltage loads occurring in the charging direction.

Adaptation to the voltage load possibly occurring in the charging or discharging direction is preferably carried out by selecting semiconductor switching elements with a suitable dielectric strength.

The at least one semiconductor switching element that blocks the current in the discharging direction in the second part of the line branch preferably has a higher dielectric strength than the at least one semiconductor switching element that blocks the charging current in the first part of the line branch.

The dielectric strength of the at least one semiconductor switching element that blocks the charging current is preferably 1% to 50%, particularly preferably 5% to 25%, above the maximum possible difference between the charging voltage provided by the voltage source and the voltage of the battery cell assembly.

The dielectric strength of the at least one semiconductor switching element that blocks the current in the discharging direction is preferably 1% to 50%, particularly preferably 5% to 25%, above the sum of the charging voltage provided by the voltage source and the voltage of the battery cell assembly.

Preferably, two or more, for example, two to four semiconductor switching elements are arranged in the second part of the line branch which is operated in the forward direction during charging of the battery cell assembly. The two or more semiconductor switching elements are particularly preferably all identical.

Particularly preferably, the two or more semiconductor switching elements all connect in parallel with one another in the second part of the line branch which is operated in the forward direction during charging of the battery cell assembly.

However, instead of the two or more semiconductor switching elements, it is naturally also possible for only one semiconductor switching element to be arranged in the second part of the line branch which is operated in the forward direction during charging of the battery cell assembly, which semiconductor switching element should then preferably have a higher dielectric strength than the at least one semiconductor switching element in the first part of the line branch.

The semiconductor switching elements in the electrical line branch are particularly preferably MOSFETs. As an alternative, however, bipolar transistors, in particular insulated gate bipolar transistors (IGBTs), can also be used as semiconductor switching elements, for example.

I also provide a battery with the described switching device. It is preferred that the battery has at least one of the following features:

1) It comprises a battery cell assembly.
2) It comprises a battery management system.
3) The battery management system comprises the described switching device.
4) The battery management system also comprises a monitoring device that monitors parameters relevant to the correct operation and safety of the battery.
5) The monitoring device comprises a control unit coupled to the switching device such that it can interrupt a flow of current between the battery cell assembly and a voltage source connected to the battery cell assembly via the switching device during charging of the battery.

The control unit is particularly preferably coupled to the semiconductor switching elements of the switching device. If these are MOSFETs, the gate connections of the MOSFETs electrically connect to the control unit, with the result that the control unit can control a flow of current through the MOSFETs by applying a voltage.

Further features, details and advantages of my devices and batteries emerge from the following description of selected, preferred examples and the drawings.

FIG. 1 illustrates, in a highly simplified manner, a known electronic switching device between a battery cell assembly 1 comprising a plurality of battery cells and an external DC voltage source 2 according to the prior art. That switching device is intended to ensure that current flows only when a monitoring device enables the flow of current.

Semiconductor switching elements, MOSFETs in this instance, are used for switching. They may block or let the current pass through on the basis of a blocking voltage between the gate and the source. On account of their internal properties, however, they can block the current only in one direction. Therefore, the arrangement illustrated in FIG. 1 contains a first line branch consisting of two parts 3, 4 and in which a semiconductor switching element T1, T2 is respectively arranged between the positive pole of the battery cell assembly 1 and the corresponding positive pole of the external DC voltage source 2. Both semiconductor switching elements T1, T2 are connected in the reversed manner, that is to say in anti-series. D1 and D2 denote intrinsic diodes (body diodes) of the semiconductor switching elements T1 and T2. The semiconductor switching element T1 arranged in the partial branch 3 has a forward direction from right to left, that is to say from the external DC voltage source 2 to the battery cell assembly 1. Accordingly, the semiconductor switching element T2 in the line partial branch 4 has a forward direction from left to right, that is to say in the direction from the battery cell assembly 1 to the external DC voltage source 2.

To ensure a sufficient current-carrying capacity, a second line branch likewise consisting of two parts 5, 6 connects in parallel to the line branch consisting of the two parts 3, 4. The second line branch has exactly the same structure as the line branch consisting of the parts 3, 4. The gate connections of all four semiconductor switching elements are combined by a line 7 leading to a control unit, and the source connections of all four semiconductor switching elements T1 to T4 are combined by a line 8. In principle, this could also be implemented differently. It would therefore be possible for the semiconductor switching elements T1 to T4 to each be controlled separately and/or for the semiconductor switching elements to be interconnected at their drain connections D. However, the arrangement illustrated in FIG. 1 is generally preferred.

The control unit is part of a monitoring device that monitors possible parameters important for the operation and safety both of the battery and of the components dependent on the latter, for example, also the temperature of the battery cell assembly 1. If one of the monitored parameters leaves a predefined framework, the control unit can interrupt the flow of current between the battery cell assembly 1 and the DC voltage source 2.

FIG. 1 shows that the switching device is symmetrical with respect to the dividing line S between the two parts 3, 4 and 5, 6. The four semiconductor switching elements T1 to T4 each have the same dielectric strength and differ only in terms of the direction and positioning inside the switching device.

Figure 2:
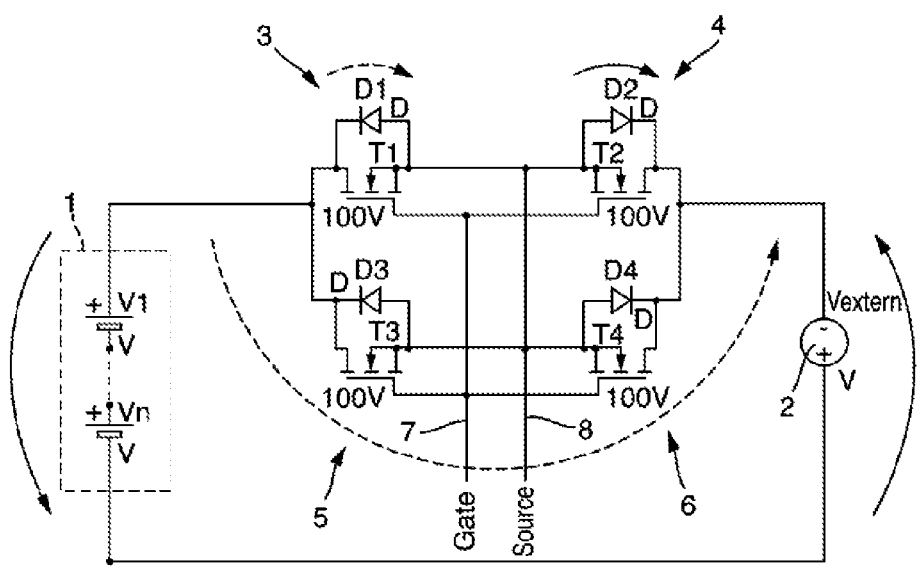
FIG. 2 schematically shows the voltage load on the switching device illustrated in FIG. 1 in the event of a polarity reversal.

The method of operation of such a switching device is now explained on the basis of FIG. 2. FIG. 2 shows a possible limit case, namely a polarity reversal of the external DC voltage source 2. In the blocking case, that is to say when the semiconductor switching elements T1, T3 are intended to block, an extremely high voltage is present at the partial branches 3, 5 since, in this case, the voltage of the battery cell assembly 1 and the voltage of the external DC voltage source 2 are added. In contrast, the partial branches 4, 6 operated in the forward direction are loaded only with a low voltage. If a voltage of the battery cell assembly of 52 V and an external DC voltage source of 57 V are assumed as an example, the result is a series circuit of 109 V, with the result that a voltage of 108.5 V is applied to the semiconductor switching elements T1, T3 in the reverse direction taking into account a voltage of 0.5 V in the forward direction (via T2, T4).

Figure 3:
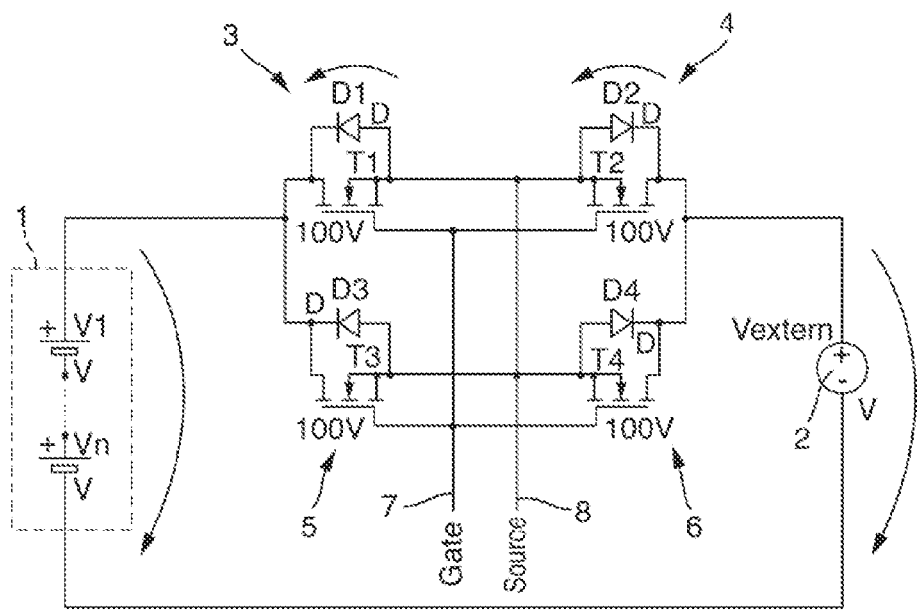
FIG. 3 schematically shows the voltage load on the switching device illustrated in FIG. 1 in the event of a voltage load in the charging direction.

FIG. 3 shows the opposite case, namely the charging operation. In the worst-case scenario, the battery cell assembly 1 has been completely discharged, that is to say has a voltage of substantially 0 V. The semiconductor switching elements T2, T4 in the partial branches 4, 6 are used to switch between letting through and blocking in this case. In the blocking case, the voltage of the external DC voltage source 2, for example, 56.5 V, is therefore applied to them.

This reveals that the symmetrical arrangement of semiconductor switching elements is not useful since the load in turn is not symmetrical. If the switching device is now designed for the highest expected load, which is necessary, the switching device is partially overdimensioned. This results in disadvantages not only in terms of costs, but also in terms of efficiency since power semiconductors with a higher dielectric strength have higher parasitic resistances and therefore losses.

Figure 4:
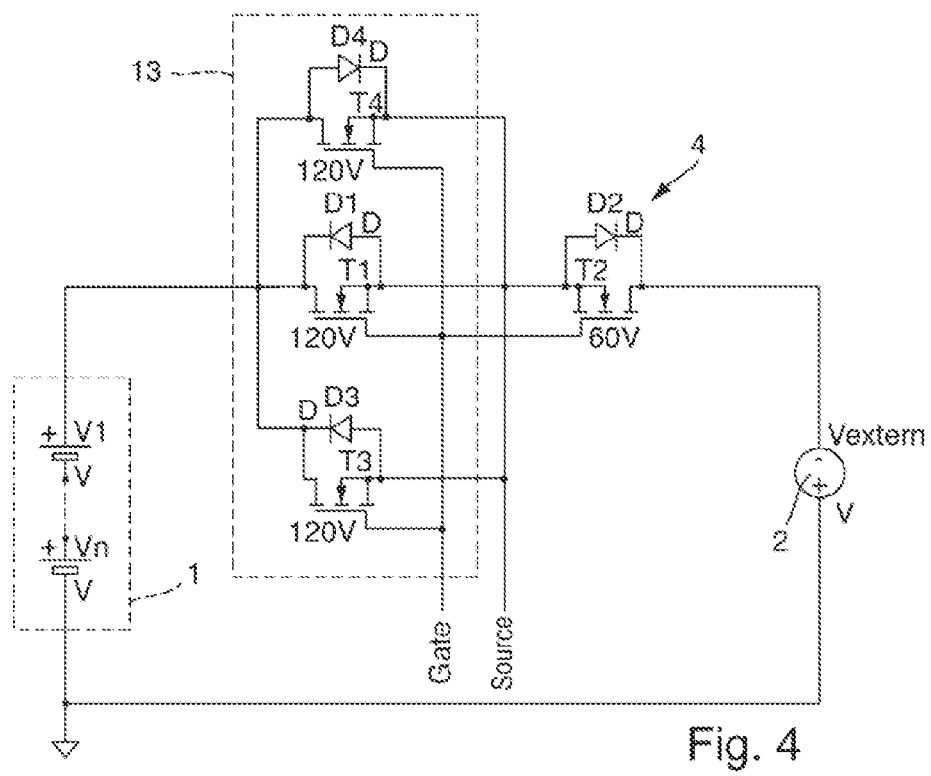
FIG. 4 schematically shows an example of my electronic switching device.

FIG. 4 now shows an example of my device. A semiconductor switching element T2 having a dielectric strength that is matched to the maximum (comparatively low) load expected in this branch 4 is arranged in the part 4 of the line branch between the external DC voltage source 2 and the battery cell assembly 1 which is loaded in the reverse direction in the case of charging. The semiconductor switching elements T1, T3, T4 arranged in the other part 13 of the line branch are matched to the (comparatively higher) load expected there. They have a higher dielectric strength.

As can be seen, the while charging engaged part 13 of the line branch in this case comprises in forward direction three semiconductor switching elements T1, T3, T4 with a high dielectric strength connected in parallel, whereas part 4 of the branch circuit, which is engaged in reverse direction comprises just one semiconductor switching element T2 with a comparatively low dielectric strength.

In this case, MOSFETs are used as semiconductor switching elements.

Numerical example:
Voltage of the external voltage source: 57 V
Battery voltage of the battery cell assembly: 52 V
Dielectric strength of T2: 60 V
Dielectric strength of T1, T3, T4: 120 V Although my device and batteries have been described in connection with specific forms thereof, it will be appreciated that a wide variety of equivalents may be substituted for the specified elements described herein without departing from the spirit and scope of this disclosure as described in the appended claims.

The invention claimed is:

1. An electronic switching device of a battery management system comprising:
   an electrical line branch in which at least two semiconductor switching elements connect in series in a reversed (anti-series) orientation, wherein
   the semiconductor switching elements are adapted to block a flow of current in the electrical line branch in one direction,
   one end of the line branch connects to a pole of a battery cell assembly and another end connects to a voltage source,
   at least one of the semiconductor switching elements has, inside the line branch, an orientation that allows it to block a charging current during charging of the battery cell assembly,
   the at least one semiconductor switching element that blocks the charging current is arranged in a first part of the line branch,
   at least one of the semiconductor switching elements has, inside the line branch, an orientation that allows it to block a current in a discharging direction during discharging of the battery cell assembly,
   the at least one semiconductor switching element that blocks, the current in the discharging direction is arranged in a second part of the line branch,
   the at least one semiconductor switching element that blocks the charging current is adapted to the largest possible voltage load possibly occurring in the part in the charging direction,
   the at least one semiconductor switching element that blocks the discharging current is adapted to a largest possible voltage load possibly occurring in the part in the discharging direction,
   the at least one semiconductor switching element that blocks the current in the discharging direction in a second part of the line branch has a higher dielectric strength than the at least one semiconductor switching element that blocks the charging current in the first part of the line branch,
   dielectric strength of the at least one semiconductor switching element that blocks the charging current is 1% to 50% above a maximum possible voltage difference between a charging voltage provided by the voltage source and voltage of the battery cell assembly, and
   dielectric strength of the at least one semiconductor switching element that blocks the current in the discharging direction is 1% to 50% above a sum of the charging voltage provided by the voltage source and the voltage of the battery cell assembly.

2. The electronic switching device according to claim 1, wherein
   two or more of the semiconductor switching elements are arranged in the second part of the line branch that is operated in a forward direction during charging of the battery cell assembly, and
   the two or more semiconductor switching elements are connected in parallel with one another.

3. The electronic switching device according to claim 1, wherein
   the semiconductor switching elements are MOSFETs or IGBTs.

4. A battery comprising:
   a battery cell assembly,
   a battery management system, and
   comprising the switching device according to claim 1, wherein
   the battery management system comprises a monitoring device that monitors parameters relevant to correct operation and safety, and
   the monitoring device comprises a control unit coupled to the switching device such that it can interrupt a flow of current between the battery cell assembly and the voltage source.

* * * * *